US008692244B2

(12) United States Patent
Kaguchi et al.

(10) Patent No.: US 8,692,244 B2
(45) Date of Patent: Apr. 8, 2014

(54) SEMICONDUCTOR DEVICE

(75) Inventors: Naoto Kaguchi, Tokyo (JP); Norihisa Asano, Tokyo (JP); Katsumi Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 188 days.

(21) Appl. No.: 13/173,324

(22) Filed: Jun. 30, 2011

(65) Prior Publication Data

US 2012/0104415 A1 May 3, 2012

(30) Foreign Application Priority Data

Oct. 27, 2010 (JP) ................................. 2010-240369

(51) Int. Cl.
*H01L 29/73* (2006.01)

(52) U.S. Cl.
USPC ................... 257/47; 257/44; 257/76; 257/77; 257/197; 257/E29.197; 257/E21.35; 257/E21.382

(58) Field of Classification Search
None
See application file for complete search history.

(56) References Cited

U.S. PATENT DOCUMENTS

| | | | | |
|---|---|---|---|---|
| 5,635,734 A | * | 6/1997 | Takayanagi et al. | 257/152 |
| 6,153,495 A | * | 11/2000 | Kub et al. | 438/459 |
| 2001/0009287 A1 | * | 7/2001 | Fujihira et al. | 257/328 |
| 2003/0222297 A1 | * | 12/2003 | Krumrey et al. | 257/302 |
| 2004/0183080 A1 | | 9/2004 | Kusumoto et al. | |
| 2005/0247974 A1 | * | 11/2005 | Matsuki et al. | 257/330 |
| 2006/0186759 A1 | * | 8/2006 | Kim et al. | 310/320 |
| 2006/0255376 A1 | * | 11/2006 | Tolonics et al. | 257/273 |
| 2007/0034943 A1 | | 2/2007 | Kushiyama et al. | |
| 2007/0114577 A1 | | 5/2007 | Narazaki | |
| 2007/0210350 A1 | * | 9/2007 | Omura et al. | 257/287 |
| 2008/0197442 A1 | | 8/2008 | Hirler et al. | |
| 2009/0194792 A1 | * | 8/2009 | Konishi et al. | 257/197 |

FOREIGN PATENT DOCUMENTS

| | | |
|---|---|---|
| EP | 0 051 500 A2 | 5/1982 |
| JP | 2006-270112 | 10/2006 |
| JP | 2007-42817 | 2/2007 |
| JP | 2007-142138 | 6/2007 |
| JP | 2010-182985 | 8/2010 |
| KR | 2002-0086747 | 11/2002 |

OTHER PUBLICATIONS

Korean Office Action issued Jan. 21, 2013 in Application No. 10-2011-0101019 (With Partial English Translation).
Office Action issued on Apr. 5, 2013 in the corresponding Germany Application No. 10 2011 083 243.2 (with English Translation).
Office Action issued Aug. 5, 2013, in Korean Application No. 10-2011-0101019 (with English Translation).
Office Action issued Nov. 18, 2013 to Chinese Patent Application No. 201110198350.X, with partial English translation.

* cited by examiner

*Primary Examiner* — Fei Fei Yeung Lopez
(74) *Attorney, Agent, or Firm* — Oblon, Spivak, McClelland, Maier & Neustadt, L.L.P.

(57) ABSTRACT

A semiconductor device includes: an emitter electrode formed of a silicide film, and provided on a semiconductor layer; an insulating film provided on the emitter electrode; and an electrode pad made of Al, and provided on the insulating film.

5 Claims, 4 Drawing Sheets

F I G. 1 A
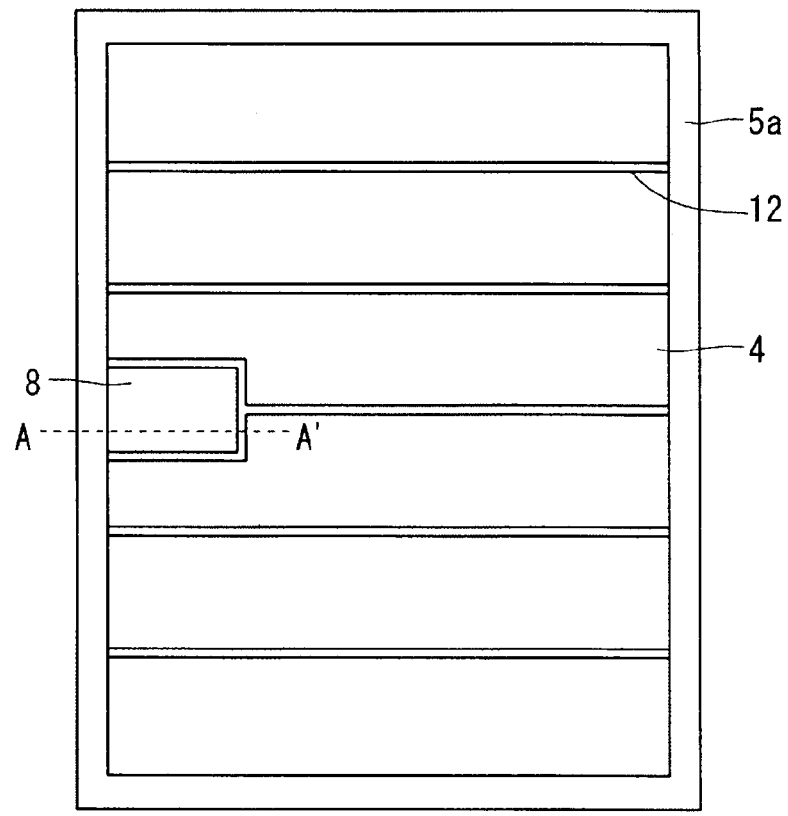
F I G. 1 B
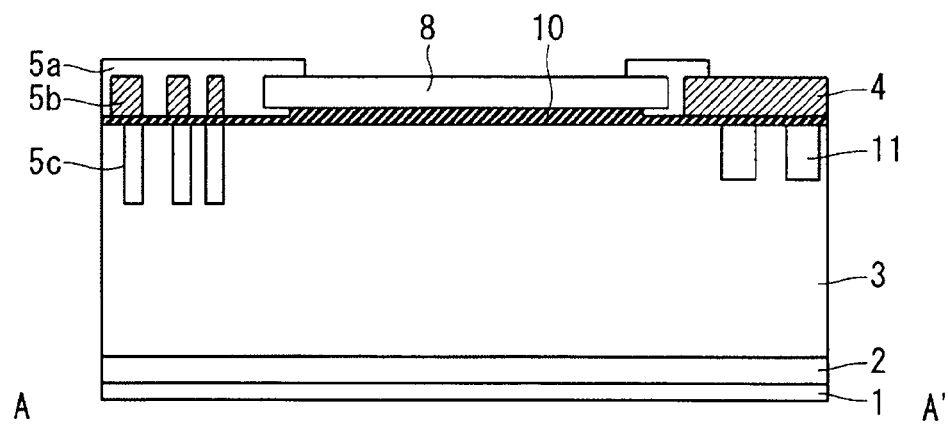

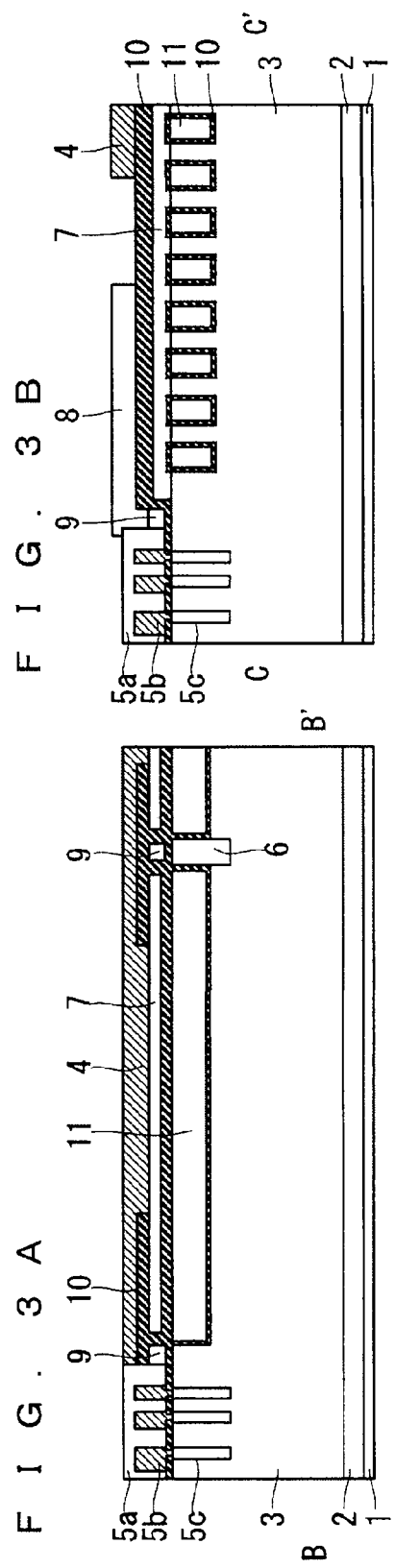

SEMICONDUCTOR DEVICE

BACKGROUND OF THE INVENTION

1. Field of the Invention

The present invention relates to formation of an electrode in a semiconductor switching device such as a JFET, an SIT, a MOSFET, and an IGBT.

2. Description of the Background Art

Semiconductor switching devices responsible for a switching operation and used in power sources and other electrical instruments include JFETs, SITs, MOSFETs, and IGBTs. In such semiconductor switching devices, an effective area to house a cell is an important parameter to determine characteristics and cost, and is required to be increased.

Meanwhile, a region directly under an electrode pad is an invalid region (see Japanese Patent Application Laid-Open No. 2007-42817). In order to enhance characteristics and realize cost reduction, the invalid region directly under the electrode pad should be used as a valid region.

Assembly techniques intended to enhance power cycle performance or heat dissipation performance include direct lead bonding (DLB, see Japanese Patent Application Laid-Open No. 2007-142138) of an emitter electrode and pressure bonding. Meanwhile, an emitter electrode may be divided by wiring of a gate interconnect line to suppress gate delay. This structure however becomes an obstacle to the application of the aforementioned assembly techniques.

SUMMARY OF THE INVENTION

The present invention is intended to provide a semiconductor device that makes a region directly under an electrode pad valid.

The semiconductor device of the present invention includes an emitter electrode, an insulating film, and an electrode pad. The emitter electrode is formed of a silicide film, and provided on a semiconductor layer. The insulating film is provided on the silicide film to form the emitter electrode. The electrode pad is made of Al, and provided on the insulating film.

The electrode pad is provided over the silicide film to form the emitter electrode while the insulating film is placed between the electrode pad and the silicide film. Thus, a region directly under the electrode pad can be made valid.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1A and 1B show the structures of an IGBT chip that is a semiconductor device relating to a prerequisite technique of the present invention;

FIGS. 3A and 3B are sectional views of the semiconductor device of the first preferred embodiment.

EMBODIMENT FOR CARRYING OUT THE INVENTION

Prerequisite Technique

Figure 2A:
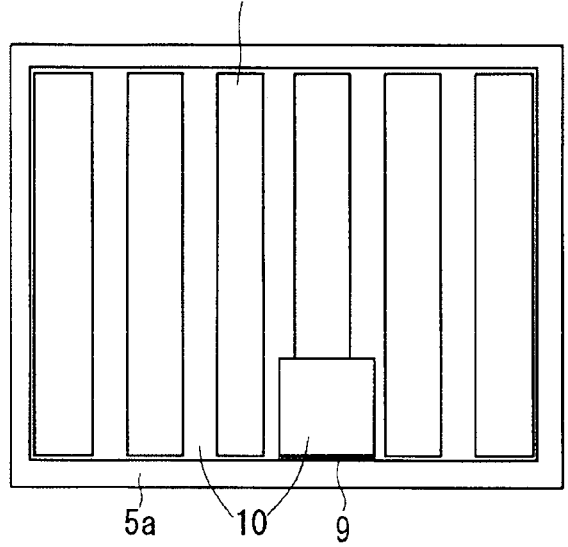
FIGS. 2A to 2C are plan views each showing a layer to form a semiconductor device of a first preferred embodiment.

FIGS. 1A and 1B show the structures of an IGBT chip that is a semiconductor device relating to a prerequisite technique of the present invention. FIG. 1A is a plan view, and FIG. 1B is a sectional view taken along a line A-A' in FIG. 1A.

As shown in FIG. 1A, a gate pad 8 and an emitter electrode 4 are provided on a surface of the IGBT chip. A guard ring 5a is provided to surround the gate pad 8 and the emitter electrode 4. The emitter electrode 4 is not defined in a region 12 where a gate interconnect line is placed, so the emitter electrode 4 is divided into six on the IGBT chip.

The IGBT chip shown in FIG. 1B is provided with a semiconductor layer including a p-collector layer 1, an $n^+$-buffer layer 2 provided on the p-collector layer 1, and an $n^-$-drift layer 3 provided on the $n^+$-buffer layer 2. The gate pad 8 is provided over the semiconductor layer while an insulating film 10 is placed between the gate pad 8 and the semiconductor layer. The gate pad 8 is surrounded by the guard ring 5a, and a gate interconnect line (not shown) is placed along the guard ring 5a.

The emitter electrode 4 is provided on the semiconductor layer, and on the side opposite the gate pad 8 with the guard ring 5a placed between the gate pad 8 and the emitter electrode 4. Gate electrodes 11 are provided in the surface of the semiconductor layer, and in a region below the emitter electrode 4 while the insulating film 10 is placed between the gate electrodes 11 and the emitter electrode 4.

A guard ring is provided on the outer circumference of the IGBT chip. The guard ring includes a $p^+$-guard ring 5c provided in the semiconductor layer, the guide ring 5a formed of a semiconductor layer or an insulating film provided on the surface of the IGBT chip, and a guard ring 5b made of Al and provided in the guard ring 5a.

As shown in FIG. 1B, in the IGBT chip relating to the prerequisite technique, a cell cannot be placed in a region directly under the gate pad 8. So, an effective area to house a cell is made smaller by the area of the gate pad 8. So, an IGBT chip of the present invention has been made to place a cell even in a region directly under the gate pad 8.

First Preferred Embodiment

In an IGBT chip as a semiconductor device of a first preferred embodiment, an emitter electrode is formed by using a film of silicide (such as WSi2, TiSi2, CoSi2, and NiSi2) having a low resistance and a high strength. A gate pad as an example of an electrode pad is provided over the emitter electrode while an insulating film is placed between the gate pad and the emitter electrode. Further, the gate pad and a gate interconnect line contact with each other through a through hole, and a valid cell is placed in an invalid region directly under the pad.

Figure 2B:
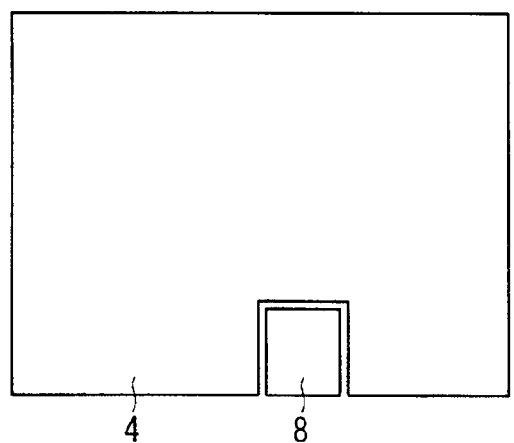
Figure 2C:
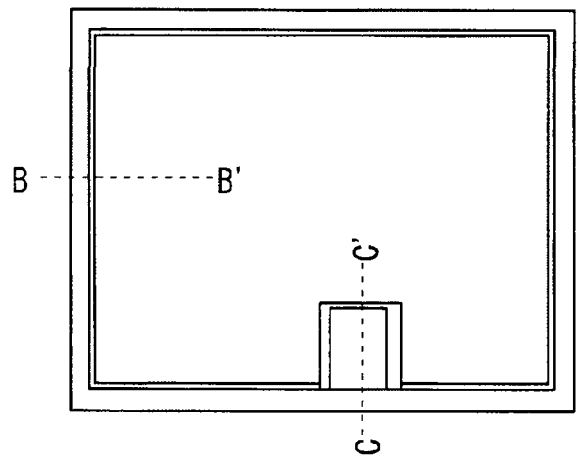

FIGS. 2A to 2C are plan views each showing a layer to form the IGBT chip of the first preferred embodiment. FIG. 2A is a plan view of a lower layer. FIG. 2B is a plan view of an upper layer to be placed on the lower layer. FIG. 2C is a plan view showing a state where the upper layer is placed on the lower layer.

As shown in FIG. 2A, a guard ring 5a covers the outer circumference of the IGBT chip, and multiple silicide films (salicide films) to form an emitter electrode 7 are provided in lines on an insulating film 10 surrounded by the guard ring 5a. In a region in which a gate pad 8 is to be placed, the silicide film 7 is covered by the insulating film 10. FIG. 2B shows an emitter common electrode 4 and the gate pad 8. The emitter common electrode 4 is provided on the multiple silicide films 7, and is connected to each of the silicide films 7.

FIGS. 3A and 3B are sectional views of the IGBT chip of the first preferred embodiment. FIG. 3A is a sectional view taken along a line B-B' in FIG. 2C, and which shows the structure of a region directly under the emitter pad 4. FIG. 3B is a sectional view taken along a line C-C' in FIG. 2C, and which shows the structure of a region directly under the gate pad 8.

The IGBT chip shown in FIG. 3A is provided with a semiconductor layer including a p-collector layer 1, an n$^+$-buffer layer 2 provided on the p-collector layer 1, and an n$^-$-drift layer 3 provided on the n$^+$-buffer layer 2. Not only Si but also wide-gap semiconductors such as SiC, GaN, and diamond are applicable to form the layers 1 to 3 of the semiconductor layer. A gate electrode 11 made of polysilicon is provided in a surface of the n$^-$-drift layer 3. The gate electrode 11 is divided by a p$^+$-separating layer 6 into multiple gate electrodes 11, thereby forming multiple cells. The emitter electrode 7 formed of silicide films is provided over the gate electrodes 11 while the insulating film 10 is placed between the emitter electrode 7 and the gate electrodes 11. The emitter pad (emitter common electrode) 4 made of Al is provided on the emitter electrode 7 formed of the multiple silicide films arranged in lines. The structure of a guard ring is the same as that of the IGBT chip of the prerequisite technique shown in FIG. 1.

The sectional view of FIG. 3B taken along the line C-C' in FIG. 2C shows the cross sections of the gate pad 8 and the region directly under the gate pad 8. As shown in FIG. 3B, the multiple gate electrodes 11 made of polysilicon are provided in a surface of the semiconductor layer. The emitter electrode 7 made of silicide is provided over the gate electrodes 11 while the insulating film 10 is placed between the emitter electrode 7 and the gate electrodes 11. Although not shown, n-emitter regions and p-base regions contacting the emitter electrode 7 are provided on respective side surfaces of the gate electrodes 11. The emitter electrode 7 and the p-collector layer 1 are conductively connected through the p-base regions functioning as channel regions. The gate pad 8 is provided over the emitter electrode 7 while the insulating film 10 is placed between the gate pad 8 and the emitter electrode 7.

Reference numeral 9 represents a silicide film provided on a gate interconnect line, or the gate interconnect line. The gate interconnect line 9 is provided inside the guard ring 5*a* on the outer circumference of the chip, and between the lines of the emitter electrode 7 (on the p$^+$-separating layer 6) to extend in parallel with the emitter electrode 7. The gate pad 8 and the gate electrodes 11 contact with each other through the gate interconnect line 9. The gate interconnect line 9 is formed of a low resistance silicide film, so that gate delay is suppressed.

The structure of the guard ring is the same as that of the IGBT chip of the prerequisite technique shown in FIG. 1.

As described above, formation of the emitter electrode 7 formed of silicide films under the electrode pad 8 makes it possible to place a cell even in a region directly under the electrode pad 8 that has conventionally been made invalid. This increases an effective area, so that characteristic enhancement and cost reduction may be realized.

The emitter electrode has a two-layer structure with the emitter pad (emitter common electrode) 4 and the multiple silicide films 7, so the gate interconnect line 9 can be placed under the emitter pad 4. Thus, the emitter pad 4 can exist as one pad without being divided by the gate interconnect line 9. This facilitates direct lead bonding or pressure bonding, so that probability of assembly failure is reduced.

Modifications

Figure 4:
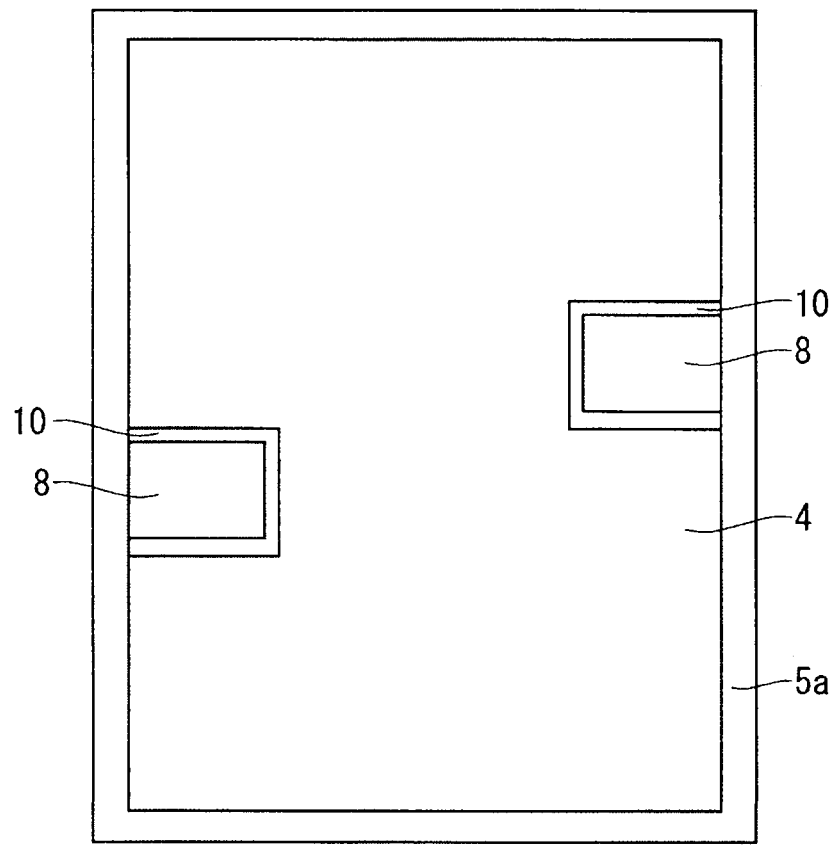
FIG. 4 is a plan view of a semiconductor device of a modification of the first preferred embodiment.

FIG. 4 is a plan view of an IGBT chip of a modification of the first preferred embodiment. In the IGBT chip of the first preferred embodiment, a region directly under the gate pad 8 is made valid, so there will be no increase of an invalid region even if the multiple gate pads 8 are placed in the chip. Thus, the multiple gate pads 8 can be provided in the chip as shown in FIG. 4. In this case, gate resistance is controlled easily, so that countermeasures against gate oscillation can be taken easily. Provision of multiple gate pads prevents gate delay to allow the ON and OFF of a cell to be balanced better, thereby increasing tolerance to short circuit and tolerance to RBSOA.

While the gate pad 8 is used in the first preferred embodiment, a current sensing pad or a temperature sensing pad may take the place of the gate pad 8. Such a sensing pad may be placed at any position if the emitter electrode 7 made of silicide is provided under the sensing pad, so that the sensing pad realizes measurement with enhanced accuracy.

The silicide films to form the emitter electrode 7 have a strength higher than that of Al, so that damage to be generated on a cell during wafer test, chip test, and assembly is suppressed.

Effects

The semiconductor device of the present invention includes: the emitter electrode 7 formed of a silicide film, and provided on the semiconductor layer; the insulating film 10 provided on the silicide film to form the emitter electrode 7; and the electrode pad 8 made of Al and provided on the insulating film 10. Thus, a region directly under the electrode pad 8 can be made valid.

The electrode pad 8 is used as a gate electrode, a current sensing electrode, or a temperature sensing electrode. A region directly under such a sensing electrode is not made invalid if the electrode pad 8 is used as the sensing electrode. Thus, the sensing electrode can be placed at a desired position in the chip, so that the sensing electrode realizes measurement with enhanced accuracy.

The electrode pad 8 may be used as a gate pad, and multiple gate pads 8 may be provided. This makes control of gate resistance easy, so that countermeasures against gate oscillation can be taken easily. Provision of the multiple gate pads 8 prevents gate delay to allow the ON and OFF of a cell to be balanced better, thereby increasing tolerance to short circuit and tolerance to RBSOA.

The silicide film has a strength higher than that of Al, so that damage to be generated on a cell during wafer test, chip test, and assembly is suppressed.

Further, the silicide film is formed of a salicide film. This also allows a region directly under the electrode pad 8 to be made valid.

The emitter electrode includes multiple silicide films 7 defined by dividing the silicide film into multiple portions, and the emitter common electrode 4 provided on the multiple silicide films 7 and connected to each of the silicide films 7. This means that the emitter electrode is constructed of a two-layer structure, so the gate interconnect line 9 can be placed under the emitter pad 4. Thus, the emitter pad 4 can exist as one pad without being divided by the gate interconnect line 9. This facilitates direct lead bonding or pressure bonding, so that probability of assembly failure is reduced.

The gate interconnect line 9 for electrically connecting the gate pad 8 and the gate electrodes 11 is covered by the silicide film, thereby suppressing gate delay.

The semiconductor layer is made of Si, SiC, or GaN. This also allows a region directly under the electrode pad 8 to be made valid.

While the invention has been shown and described in detail, the foregoing description is in all aspects illustrative and not restrictive. It is therefore understood that numerous modifications and variations can be devised without departing from the scope of the invention.

REFERENCE SIGNS LIST

1: P-collector layer
2: N⁺-buffer layer
3: N⁻-drift layer
4: Emitter pad
5a, 5b, 5c: Guard ring
6: P⁺-separating layer
7: Silicide film (emitter electrode)
8: Gate pad
9: Silicide film (gate interconnect line)
10: Insulating film
11: Gate electrode
12: Region where gate interconnect line is placed

What is claimed is:

1. A semiconductor device, comprising:
   an emitter electrode formed of a silicide film, and provided on a semiconductor layer;
   an insulating film provided on said silicide film to form said emitter electrode; and
   an electrode pad made of Al, and provided on said insulating film and insulated from said emitter electrode, wherein
   said emitter electrode includes
      multiple silicide films defined by dividing said silicide film into multiple portions; and
      an emitter common electrode provided on said multiple silicide films, and connected to each of said multiple silicide films, and
   said electrode pad is used as a gate pad, and multiple electrode pads are provided.

2. The semiconductor device according to claim 1, wherein said silicide film has a strength higher than that of Al.

3. The semiconductor device according to claim 1, wherein said silicide film is formed of a salicide film.

4. The semiconductor device according to claim 1, further comprising multiple gate electrodes provided in said semiconductor layer, wherein
   the semiconductor device further comprising a gate interconnect line for electrically connecting said gate pad and said multiple gate electrodes, wherein
   said gate interconnect line is formed of a silicide film.

5. The semiconductor device according to claim 1, wherein said semiconductor layer is made of Si, SiC, or GaN.

* * * * *